(12) United States Patent
Wong et al.

(10) Patent No.: US 7,391,078 B2
(45) Date of Patent: Jun. 24, 2008

(54) NON-VOLATILE MEMORY AND MANUFACTURING AND OPERATING METHOD THEREOF

(75) Inventors: Wei-Zhe Wong, Tainan (TW); Ching-Sung Yang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 71 days.

(21) Appl. No.: 11/161,398

(22) Filed: Aug. 2, 2005

(65) Prior Publication Data

US 2006/0170038 A1 Aug. 3, 2006

(30) Foreign Application Priority Data

Jan. 31, 2005 (TW) .............................. 94102849 A

(51) Int. Cl.
*H01L 29/76* (2006.01)
*H01L 29/94* (2006.01)
*H01L 31/62* (2006.01)
*H01L 31/113* (2006.01)
*H01L 31/119* (2006.01)

(52) U.S. Cl. .................. 257/330; 257/314; 257/315; 257/316; 257/317; 257/318; 257/319; 257/320; 257/321; 257/322; 257/323; 257/324; 257/325; 257/326; 257/327; 257/E21.679; 257/E27.078; 257/E29.3; 257/E29.309; 257/E21.179; 257/E21.182; 257/E21.209; 257/E21.21; 257/E21.422; 257/E21.423; 257/E21.694

(58) Field of Classification Search ......... 257/314–327, 257/330, E27.078, E29.3–E29.309, E21.179–E21.182, 257/E21.209–E21.21, E21.422, E21.423, 257/E21.679–E21.694
See application file for complete search history.

(56) References Cited

U.S. PATENT DOCUMENTS

| 6,025,626 | A | * | 2/2000 | Tempel | 257/315 |
|---|---|---|---|---|---|
| 6,897,520 | B2 | * | 5/2005 | Vora | 257/316 |
| 6,936,887 | B2 | * | 8/2005 | Harari et al. | 257/319 |
| 6,952,031 | B2 | * | 10/2005 | Yamauchi | 257/314 |
| 7,038,271 | B2 | * | 5/2006 | Nomoto et al. | 257/324 |
| 7,049,652 | B2 | * | 5/2006 | Mokhlesi et al. | 257/315 |
| 7,061,043 | B2 | * | 6/2006 | Owa | 257/316 |
| 7,119,394 | B2 | * | 10/2006 | Hsieh et al. | 257/316 |

(Continued)

OTHER PUBLICATIONS

Article titled "A Giga-Scale Assist-Gate(AG)-AND-Type Flash Memory Cells with 20-MB/s Programming Throughput for Content-Downloading Applications" authored by Kobayashi et al. in 2001, *IEEE* (4 pages).

(Continued)

*Primary Examiner*—Steven Loke
*Assistant Examiner*—Tram H Nguyen
(74) *Attorney, Agent, or Firm*—Jianq Chyun IP Office

(57) ABSTRACT

A non-volatile memory is provided. A substrate having a plurality of trenches and a plurality of select gates is provided. The trenches are arranged in parallel and extend in a first direction. Each of the select gates is disposed on the substrate between two adjacent trenches respectively. A plurality of select gate dielectric layers are disposed between the select gates and the substrate. A plurality of composite layers are disposed over the surface of the trenches and each composite layer has a charge trapping layer. A plurality of word lines are arranged in parallel in a second direction, wherein each of the word lines fills the trenches between adjacent select gates and is disposed over the composite layers.

8 Claims, 9 Drawing Sheets

U.S. PATENT DOCUMENTS

| | | | | |
|---|---|---|---|---|
| 7,138,681 | B2* | 11/2006 | Forbes et al. | 257/316 |
| 2002/0096703 | A1* | 7/2002 | Vora | 257/315 |
| 2003/0015752 | A1* | 1/2003 | Palm et al. | 257/315 |
| 2003/0143808 | A1* | 7/2003 | Jang | 438/257 |
| 2003/0209767 | A1* | 11/2003 | Takahashi et al. | 257/390 |
| 2003/0235076 | A1* | 12/2003 | Forbes | 365/185.03 |
| 2004/0012998 | A1* | 1/2004 | Chien et al. | 365/185.2 |
| 2004/0097036 | A1* | 5/2004 | Hsiao et al. | 438/257 |
| 2004/0165443 | A1* | 8/2004 | Harari | 365/185.18 |
| 2005/0062091 | A1* | 3/2005 | Ding | 257/314 |
| 2005/0082600 | A1* | 4/2005 | Hsu et al. | 257/317 |
| 2005/0237777 | A1* | 10/2005 | Hsieh et al. | 365/63 |
| 2005/0250335 | A1* | 11/2005 | Huang et al. | 438/700 |
| 2006/0086967 | A1* | 4/2006 | Hsieh et al. | 257/314 |

OTHER PUBLICATIONS

Article titled "90-nm-node-multi-level AG-AND type flash memory with cell size of true 2 $F^2$/bit and programming throughput of 10MB/s" authored by Sasago et al. in 2003, *IEEE* (4 pages).

* cited by examiner

NON-VOLATILE MEMORY AND MANUFACTURING AND OPERATING METHOD THEREOF

CROSS-REFERENCE TO RELATED APPLICATION

This application claims the priority benefit of Taiwan application Ser. no. 94102849, filed on Jan. 31, 2005. All disclosure of the Taiwan application is incorporated herein by reference.

BACKGROUND OF THE INVENTION

1. Field of the Invention

The present invention relates to a semiconductor device. More particularly, the present invention relates to a non-volatile memory and manufacturing and operating method thereof.

2. Description of the Related Art

Among the various types of non-volatile memory products, electrically erasable programmable read only memory (EEPROM) is a memory device that has been widely used inside most personal computer systems and electronic equipment. In an EEPROM, data can be stored, read out or erased from the EEPROM numerous times and any stored data is retained even after power is cut off.

Typically, the floating gate and the control gate of an EEPROM cell is fabricated using doped polysilicon. To prevent errors in reading data from an EEPROM due to over-erasing, a select gate is disposed on the sidewalls of the control gate and the floating gate above the substrate, thereby forming a split-gate structure.

On the other hand, because doped polysilicon is used to fabricate the floating gates, any defects in the tunneling oxide layer under the floating gate can easily produce a leakage current and affect the reliability in the device.

To resolve the current leakage problem in the EEPROM, a charge-trapping layer often replaces the conventional polysilicon floating gate of the memory. The charge-trapping layer is fabricated using silicon nitride, for example. In general, an oxide layer is formed both above and below the silicon nitride charge-trapping layer to form a stacked structure including an oxide-nitride-oxide (ONO) composite layer. Read-only memory having this type of stacked gate structure is often referred to as a silicon-oxide-nitride-oxide-silicon (SONOS) memory device.

At present, an AND type memory array structure, constructed using split-gate memory cells with ONO structure, is disclosed in U.S. Patent application US2004/0084714. FIG. 1 is a schematic cross-sectional view of a conventional AND type memory cell structure. As shown in FIG. 1, the memory cell has a triple-well structure composed of a p-type silicon substrate 16, an n-type well 15 and a p-type well 14. A plurality of n-type diffusion layers 2, 3, 6 and 7 are disposed within the p-type well 14. A plurality of assist electrodes 4, 8 and 9 are disposed on the substrate. A gate oxide layer 18 is disposed between assist electrodes 4, 8 and 9 and the substrate. A control electrode 5 is disposed on the substrate to serve as a word line. A silicon oxide layer 19, a silicon nitride layer 17, and a silicon oxide layer 20 are sequentially laid between the control gate and the substrate and between the control gate 5 and the assist electrodes 4, 8, 9. The silicon nitride layer 17 between the assist electrode 4 and its adjacent n-type diffusion layers 2, 3 are divided into two charge-trapping regions 10 and 11. When a voltage is applied to the assist electrode 4, an inversion layer 1 is formed in the surface of the substrate under the assist electrode 4.

With the trend toward increasing the level of integration of integrated circuits and miniaturizing electronic devices, the size of the aforementioned AND type memory cell needs to be reduced. One way of shrinking the AND type memory cell is to reduce the length of the assist electrode and minimize the distance separating the n-type diffusion layers 2, 3, 6, 7 and the assist electrodes 4, 8, 9. However, shortening the length of the assist electrodes 4, 8, 9 and minimizing the distance between the n-type diffusion layers 2, 3, 6, 7 and the assist electrodes 4, 8, 9 bring the n-type diffusion layer 2, 3, 6, 7 closer together. As a result, abnormal electrical punch-through of the channel underneath the memory cell occurs with higher frequency. To prevent the n-type diffusion layers 2, 3, 6 and 7 from getting too close to cause the channel underneath the memory cell to conduct, the n-type diffusion layers 2, 3, 6, 7 must be separated from each other by a minimum distance, and as a result, the dimension of each memory cell cannot be further minimized.

SUMMARY OF THE INVENTION

Accordingly, at least one objective of the present invention is to provide a non-volatile memory and manufacturing and operating method thereof. The non-volatile memory has no device isolation structure between various memory cell arrays and no contact and no doped region between various memory cells so that the overall level of integration of the device can be increased.

At least a second objective of the present invention is to provide a non-volatile memory and manufacturing and operating method thereof that can be efficiently programmed to increase the operating speed of the device.

At least a third objective of the present invention is to provide a non-volatile memory and manufacturing and operating method thereof that has simpler processing steps for reducing overall production cost.

To achieve these and other advantages and in accordance with the purpose of the invention, as embodied and broadly described herein, the invention provides a non-volatile memory. The non-volatile memory mainly includes a substrate, a plurality of select gates, a plurality of select gate dielectric layers, a composite layer, and a plurality of word lines. The substrate has a plurality of trenches arranging in parallel to each other and extending in a first direction. The select gates are disposed on the substrate between two adjacent trenches respectively. The select gate dielectric layers are disposed between the select gate and the substrate. The composite layer is disposed over the surface of the trenches, the composite layer includes a charge trapping layer. The word lines are disposed on the composite layer filling the trench between adjacent select gates. The word lines are arranged in parallel in a second direction, wherein each of the word lines fills the trenches between adjacent select gates and is disposed over the composite layers.

In the aforementioned non-volatile memory, a plurality of bit lines are formed in the substrate underneath the select gate when a voltage is applied to the select gate.

In the aforementioned non-volatile memory, the composite layer not only covers the surface of the trenches, but also covers the surface of the select gates. The composite layer further includes a bottom dielectric layer and a top dielectric layer. The charge-trapping layer is fabricated using a material including silicon nitride or doped polysilicon. The bottom dielectric layer and the top dielectric layer are fabricated using a material including silicon oxide.

In the aforementioned non-volatile memory, the composite layers and the word lines disposed thereon constitute a plurality of two-bits memory cells respectively.

In the aforementioned non-volatile memory, the select gates and the word lines are fabricated using doped polysilicon.

In the non-volatile memory of the present invention, the select gates, the word line located between two adjacent select gates, and the composite layer together form a plurality of memory cells. Because there is no gap and no device isolation structure and contact between various memory cells, the level of integration of the memory cell array can be increased. Furthermore, each composite layer on the two sidewalls of the trenches contains a single bit of data. In other words, a single memory cell in the non-volatile memory of the present invention can store two bits of data. Moreover, the two bits of data in the memory cell are physically isolated from each other by a trench. Hence, any interference between them is minimized. In addition, by controlling the depth of the trenches, the channel length can be adjusted to prevent abnormal electrical punch-through in the memory cell.

The present invention also provides a method of operating a non-volatile memory, adapted for a memory array including an array of memory cells. Each memory cell array includes a plurality of select gate structures on a substrate, a composite layer, a plurality of control gates, a plurality of word lines, a plurality of select gate lines and a plurality of bit lines. Each select gate structure includes a select gate dielectric layer and a select gate sequentially stacked on the substrate and a trench in the substrate between neighboring select gates. The composite layer covers the substrate and the select gates. The composite layer includes a charge-trapping layer. The control gates are disposed on the composite layer, filling the trench between two adjacent select gates. The word lines are laid in the row direction parallel to each other and coupled to the control gates in the same row. The select gate lines are laid in the column direction parallel to each other and coupled to the select gates in the same column. The bit lines are laid in the column direction in parallel to each other. When a voltage is applied to the select gate line, a bit line is formed in the substrate underneath the select gate line. Two adjacent select gates, the control gate between two adjacent select gates, and the composite layer together form an array of memory cells. Furthermore, two neighboring memory cells share a common select gate line. The composite layer between the control gate of various memory cells and a first sidewall of various trenches contains a first bit, and the composite layer between the control gate of various memory cells and a second sidewall of the various trenches contains a second bit. The method of operating the non-volatile memory includes the following steps.

To perform a programming operation, a first voltage is applied to a selected word line coupled to a selected memory cell; a second voltage is applied to a first selected select gate line adjacent to the selected memory cell on the first bit side; a third voltage is applied to a second selected select gate line next to the first selected select gate line on the first bit side so that a first selected bit line is formed in the substrate underneath the second selected select gate line; a fourth voltage is applied to the first selected bit line; a fifth voltage is applied to a third selected select gate line adjacent to the selected memory cell on the second bit side so that a second selected bit line is formed in the substrate underneath the third selected select gate line; a sixth voltage is applied to the second selected bit line; a seventh voltage is applied to a fourth selected select gate line next to the third selected select gate line on the second bit side, and a 0V to is applied the unselected select gate lines, wherein the second voltage is close to the threshold voltage of the select gate line, the fifth voltage and the third voltage is higher than the second voltage, the sixth voltage is higher than the fourth voltage, and the first voltage is higher than the second voltage so that the first bit is programmed through source side injection.

In the aforementioned method of operating the non-volatile memory, the first voltage is about 10V, the second voltage is about 1V, the third voltage is about 5V, the fourth voltage is about 0V, the fifth voltage is about 8V, the sixth voltage is about 4.5V, and the seventh voltage is about 0V.

In the aforementioned method of operating the non-volatile memory, the programming operation further includes the following steps. An eighth voltage is applied to the selected word line coupled to the selected memory cell; a ninth voltage is applied to the third selected select gate line adjacent to the selected memory cell on the second bit side; a tenth voltage is applied to the fourth selected select gate line next to the third selected select gate line on the second bit side so that a third selected bit line is formed in the substrate underneath the fourth selected select gate line; a eleventh voltage is applied to the third selected bit line; a twelfth voltage is applied to the first selected select gate line adjacent to the selected memory cell on the first bit side so that a fourth selected bit line is formed in the substrate underneath the first selected select gate line; a thirteenth voltage is applied to the first selected bit line; a fourteenth voltage is applied to the second selected select gate line next to the first selected select gate line on the first bit side, and a 0V is applied to the unselected select gate lines, wherein the ninth voltage is close to the threshold voltage of the select gate line, the twelfth voltage and the tenth voltage is higher than the ninth voltage, the thirteenth voltage is higher than the eleventh voltage, and the eighth voltage is higher than the ninth voltage, so that the second bit is programmed through source side injection.

In the aforementioned method of operating the non-volatile memory, the eighth voltage is about 10V, the ninth voltage is about 1V, the tenth voltage is about 5V, the eleventh voltage is about 0V, the twelfth voltage is about 8V, the thirteenth voltage is about 4.5V, and the fourteenth voltage is about 0V.

To perform an erasing operation according to the aforementioned method of operating the non-volatile memory, an eighth voltage is applied to the word lines; a ninth voltage is applied to the substrate and making the select gate floating so that the electrons stored in the composite layer are tunnelled into the substrate. Furthermore, the voltage differential between the eighth and the ninth voltage is high enough to trigger an FN (Fowler-Nordheim) tunneling.

In the aforementioned method of operating the non-volatile memory, the voltage differential is between about −12 to −20V. The eighth voltage is about −15V and the ninth voltage is about 0V.

To perform a reading operation according to the aforementioned method of operating the non-volatile memory, a eighth voltage is applied to the selected word line coupled to the selected memory cell; an ninth voltage is applied to the first selected select gate line adjacent to the selected memory cell on first bit side so that the third selected bit line is formed in the substrate underneath the first selected select gate line; a tenth voltage is applied to the third selected bit line; a eleventh voltage is applied to the third selected select gate line adjacent to the selected memory cell on the second bit side so that the second selected bit line is formed in the substrate underneath the third selected select gate line; a twelfth voltage is applied to the second selected bit line and reading out the first bit, wherein the ninth voltage and the eleventh voltage is higher than the twelfth voltage, the twelfth voltage is higher than the tenth voltage, and the eighth voltage is higher than the threshold voltage of the memory cells without trapped electrons but smaller than the threshold voltage of the memory cells containing trapping electrons.

In the aforementioned method of operating the non-volatile memory, the eighth voltage is about 3V, the ninth voltage and the eleventh voltage are about 5V, the tenth voltage is about 0V and the twelfth voltage is about 1.5V.

To perform a reading operation according to the aforementioned method of operating the non-volatile memory, a thirteenth voltage is applied to a selected word line coupled to the selected memory cell; an fourteenth voltage is applied to the third selected select gate line adjacent to the selected memory cell on the second bit side so that the second selected bit line is formed in the substrate underneath the third selected select gate line; a fifteenth voltage is applied to the second selected bit line; a sixteenth voltage is applied to the first selected select gate line adjacent to the selected memory cell on the first bit side so that the third selected bit line is formed in the substrate underneath the first selected select gate line; a seventeenth voltage is applied to the third selected bit line and reading out the second bit, wherein the fourteenth voltage and the sixteenth voltage are higher than the seventeenth voltage, the seventeenth voltage is higher than the fifteenth voltage, and the thirteenth voltage is higher than the threshold voltage of the memory cells without trapped electrons but smaller than the threshold voltage of the memory cells containing trapping electrons.

In the aforementioned method of operating the non-volatile memory, the thirteenth voltage is about 3V, the fourteenth voltage and the sixteenth voltage are about 5V, the fifteenth voltage is about 0V, and the seventeenth voltage is about 1.5V.

The method of operating a non-volatile memory according to the present invention utilizes source side injection (SSI) to program a single bit unit into a single memory cell and uses FN tunneling to erase the data in the memory cells. Hence, the electron injection efficiency is high so that the memory cell current appearing in a normal operation is low but the operating speed is high. Moreover, the lowered memory cell current effectively reduces overall power consumption in the chip.

In addition, the control gates within the non-volatile memory of the present invention are buried in the trenches within the substrate. Since accelerated electrons are directly injected into the charge-trapping region on the sidewall of the trench, a high operating efficiency is attained. Furthermore, the two-bit storage regions within a single memory cell are effectively isolated from each other through the trench, thereby reducing interference from each other.

The present invention also provides a method of manufacturing a non-volatile memory. First, a substrate is provided. Then, a plurality of stacked gate structures are formed on the substrate. Each stacked gate structure is separated from a neighboring one by a gap. Each stacked gate structure includes a gate dielectric layer, a first conductive layer, and a mask layer. Thereafter, using the mask layers to serve as an etching masks, a plurality of trenches are formed in the substrate The trenches are arranged in parallel to each other and extend in a first direction. After removing the mask layers, a composite layer is formed on the substrate covering the surface of the trenches. The composite layer includes a bottom dielectric layer, a charge-trapping layer, and a top dielectric layer. Then, a plurality of second conductive layers is formed on the composite layer. The second conductive layers fill the trenches. The conductive layers are arranged in parallel to each other and extend in a second direction and the second direction crosses over the first direction.

In the aforementioned method of manufacturing the non-volatile memory, the step of forming the second conductive layer on the composite layer includes forming a conductive material layer over the substrate and then patterning the conductive material layer.

In the aforementioned method of manufacturing the non-volatile memory, the charge-trapping layer is fabricated using silicon nitride or doped polysilicon, and the bottom and the top dielectric layer are fabricated using silicon oxide.

In the aforementioned method of manufacturing the non-volatile memory, there is no device isolation structure between various memory cell arrays and there is no contact or doped region between various memory cells. Hence, the process of fabricating the memory is simplified and the level of integration of the memory arrays is increased.

It is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
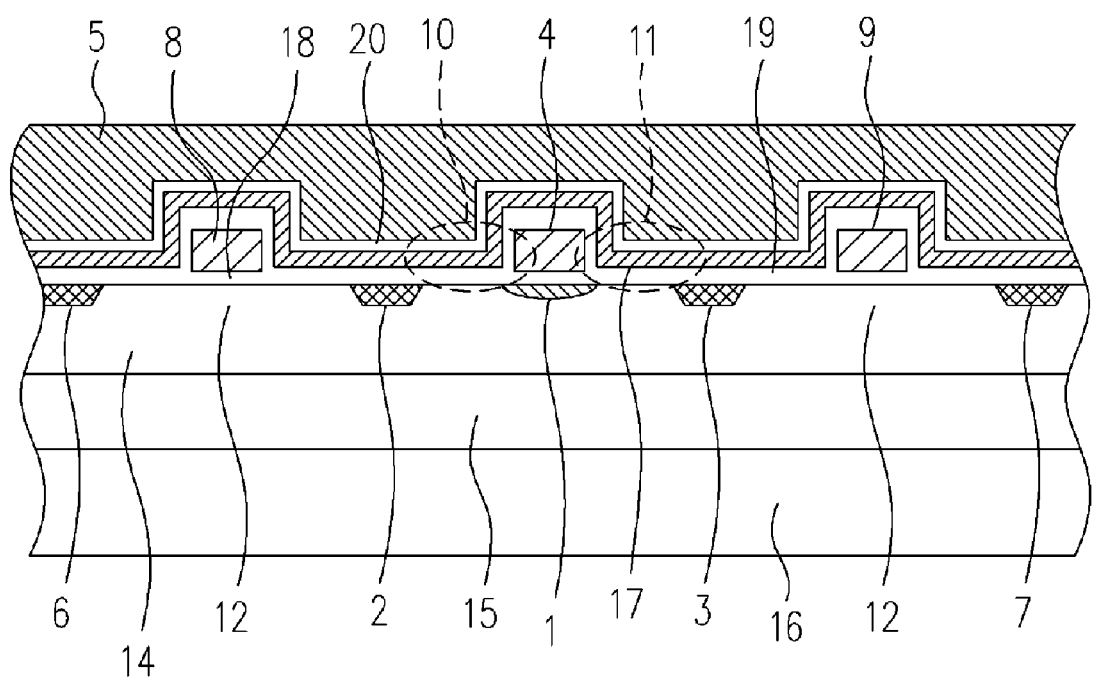
FIG. 1 is a schematic cross-sectional view of a conventional AND type memory cell structure.

Reference now is made in detail to the present embodiments of the invention, examples of which are illustrated in the accompanying drawings. Wherever possible, the same reference numbers are used in the drawings and the description to refer to the same or like parts.

Figure 2A:
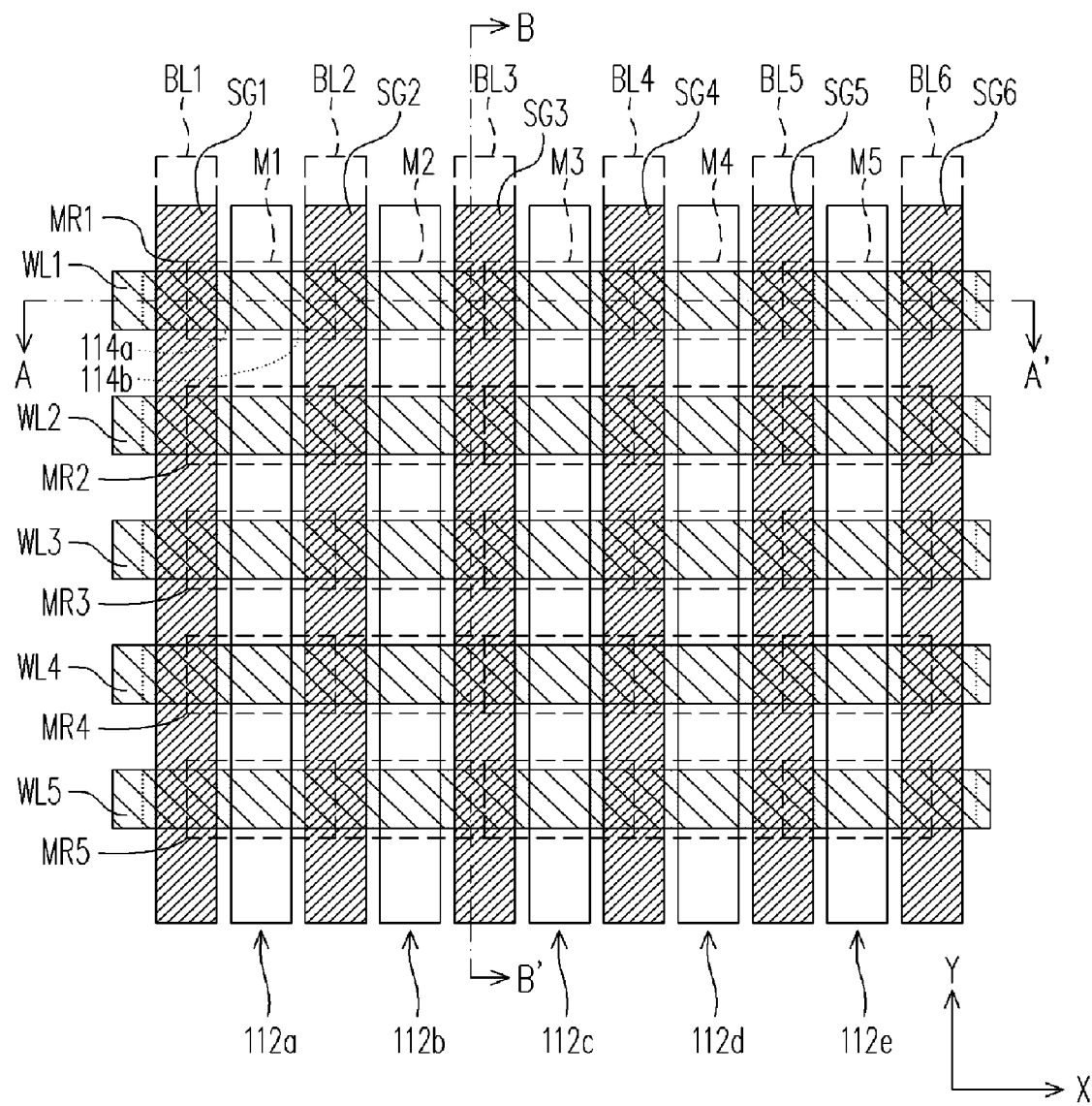
FIG. 2A is a top view of a non-volatile memory according to one embodiment of the present invention.
Figure 2B:
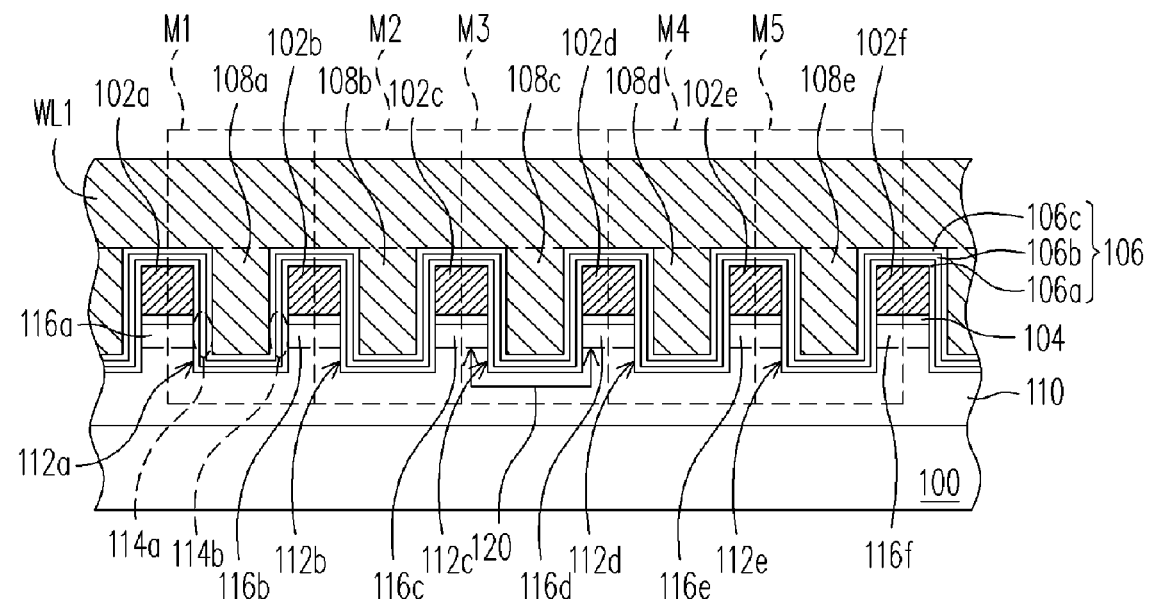
FIG. 2B is a cross-sectional view along line A-A' of FIG. 2A.
Figure 2C:
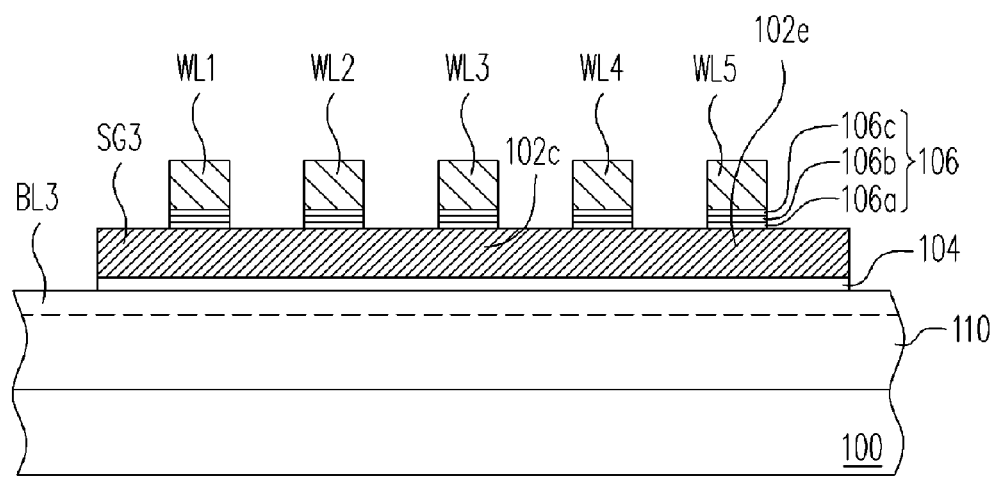
FIG. 2C is a cross-sectional view along line B-B' of FIG. 2A.

FIG. 2A is a top view of a non-volatile memory according to one embodiment of the present invention. FIG. 2B is a cross-sectional view along line A-A' of FIG. 2A. FIG. 2C is a cross-sectional view along line B-B' of FIG. 2A. As shown in FIG. 2A, the non-volatile memory array of the present invention includes a substrate 100, a plurality of memory cell arrays MR1~MR5, a plurality of word lines WL1~WL5, a plurality of select gate lines SG1~SG6, and a plurality of bit lines BL1~BL6.

The memory cell arrays MR1~MR5 are arranged to form a memory array. The word lines WL1~WL 5 are coupled to the control gates respectively in the same row of memory cells. The word lines WL1~WL5 are arranged in parallel to each other and extend in an X direction. The select gate lines SG1~SG6 are coupled to the select gates respectively in the same row of memory cells. The select gate lines SG1~SG6 are arranged in parallel to each other and extend in the Y direction. The X direction and the Y direction cross over each other. When a voltage is applied to the select gate lines SG1~SG6, an inversion layer is formed in the substrate 100 underneath the select gate lines SG1~SG6. These inversion layers serve as bit lines BL1~BL6.

In the following, the structure of the non-volatile memory cell array according to the present invention is described. Here, the memory cell array MR1 serves as an example in the illustration.

As shown in FIGS. 2A, 2B and 2C, the non-volatile memory structure in the present invention includes a substrate 100, a plurality of select gates 102a~102f, a plurality of select gate dielectric layers 104, a composite layer 106, and a plurality of control gates 108a~108e.

The substrate 100 is a silicon substrate, for example. The substrate 100 has a p-type well 110, for example. Furthermore, the substrate 100 has a plurality of trenches 112a~112e. These trenches 112a~112e are arranged in parallel to each other and extend in the Y direction.

The select gates 102a~102f are disposed on the substrate 100 between two neighboring trenches 112a~112e, and the select gates 102a~102f are fabricated using doped polysilicon, for example.

The select gate dielectric layers 104 are disposed between the select gates 102a~102f and the substrate 100. The select gate dielectric layers 104 are fabricated using silicon oxide, for example.

The composite layer 106 covers the surface of the trenches. For example, the composite layer 106 covers the upper surface of the substrate 100 and the select gates 102a~102f. The composite layer 106 includes a bottom dielectric layer 106a, a charge-trapping layer 106b, and a top dielectric layer 106c, sequentially stacked on the substrate 100. The bottom dielectric layer 106a is fabricated using silicon oxide; the charge-trapping layer 106b is fabricated using silicon nitride; and the top dielectric layer 106c is fabricated using silicon oxide, for example. Obviously, the charge-trapping layer 106b can be fabricated using any material capable of trapping or holding charges, such as doped polysilicon.

The control gates 108a~108e are disposed on the composite layer 106 within the trenches 112a~112e between two neighboring select gates 102a~102f (as shown in FIG. 2B). The control gates 108a~108e are serially connected through the word line WL1. For example, the control gates 108a~108e and the word line WL1 are formed together as an integrated unit. In other words, the control gates 108a~108e extend into areas above the select gates 102a~102f and connect with each other to form the word line WL1.

When a voltage is applied to the select gates 102a~102f (the select gate lines SG1~SG6), inversion layers 116a~116f (bit lines BL1~BL6) are formed respectively in the substrate 100 underneath the select gates 102a~102f (the select gate lines SG1~SG6). The inversion layers 116a~116f (the bit lines BL1~BL6) are isolated by the trenches 112a~112e and located in the substrate 100 underneath the select gates 102a~102f.

Using the memory cell array MR1 as an example, two adjacent select gates 102a~102f, the control gates 108a~108e between two adjacent select gates 102a~102f, and the composite layer 106 together form a plurality of memory cells M1~M5. For example, the select gate 102a, the select gate 102b, the control gate 108a, and the composite layer 106 together form the memory cell M1; the select gate 102b, the select gate 102c, the control gate 108b, and the composite layer 106 together form the memory cell M2, and likewise, the select gate 102e, the select gate 102f, the control gate 108e, and the composite layer 106 together form the memory cell M5. The memory cells M1~M5 are serially connected together in the X direction (the row direction) without any gaps in between and adjacent memory cells M1~M5 share select gates 102a~102f and bit lines BL1~BL6. For example, the memory cell M2 and the memory cell M1 share the select gate 102b, and the memory cell M2 and the memory cell M3 share the select gate 102c.

The composite layer 106 between the control gates 108a~108e of various memory cells M1~M5 and the two sidewalls of various trenches 112a~112e can store one bit of data. Using the memory cell M1 as an example, the composite layer 106 between the control gate 108a and the left sidewall of the trench 112a serves as a charge-trapping region 114a (a left bit), and the composite layer 106 between the control gate 108a and the right sidewall of the trench 114a serves as another charge-trapping region 114b (a right bit). Similarly, each of the memory cells M2~M5 has two charge-trapping regions (a left bit and a right bit). Hence, each memory cell in the non-volatile memory of the present invention can store two bits of data. Since the structures of the memory cell arrays MR2~MR5 coupled by the word lines WL2~WL5 are identical to that of the memory cell array MR1, a detailed description of them is omitted.

In the aforementioned non-volatile memory, there are no gaps between the memory cells M2~M5, and there is no device isolation structure or contact between the memory cell arrays. Therefore, the overall level of integration of the memory cell arrays can be increased. Furthermore, the composite layer 106 on the two sidewalls of the trenches 112a~112e can serve as a left charge-trapping region 114a (a left bit) and a right charge-trapping region 114b (a right bit). In other words, a single memory cell in the non-volatile memory of the present invention can store two bits of data. Moreover, the left charge-trapping region 114a (the left bit) and the right charge-trapping region 114b (the right bit) are isolated from each other by the trench. Thus, interference between the left charge-trapping region 114a (the left bit) and the right charge-trapping region 114b is minimized. In addition, length of the channel in the memory cell can be adjusted by controlling the depth of the trenches 112a~112e to prevent any abnormal electrical punch-through in the memory cell.

In the aforementioned embodiment, a total of five memory cells M1~M5 are serially connected together. Obviously, the number of serially connected memory cells can change according to the actual requirement. For example, 32 to 64 memory cell structures can be serially connected to the same word line.

Figure 3:
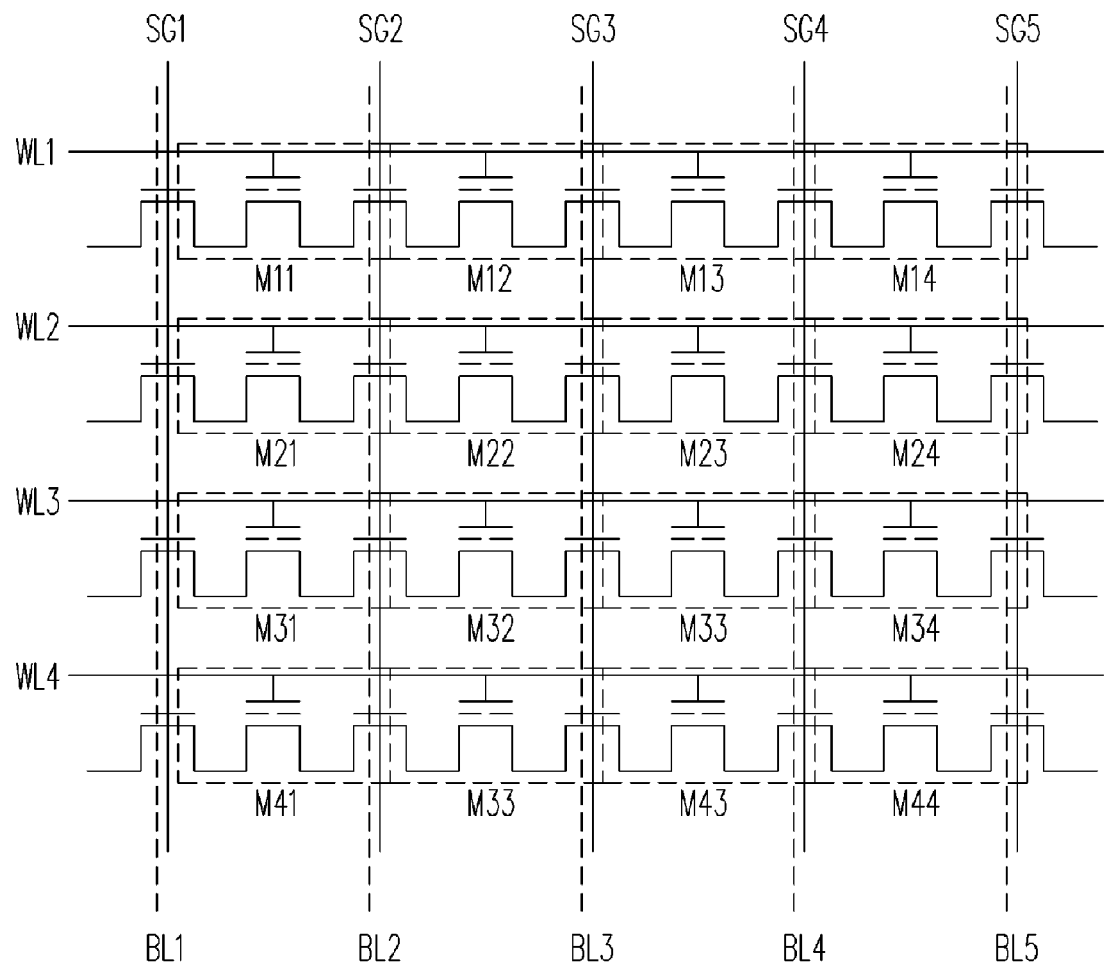
FIG. 3 is a simplified circuit diagram of a memory array according to one embodiment of the present invention.
Figure 4A:
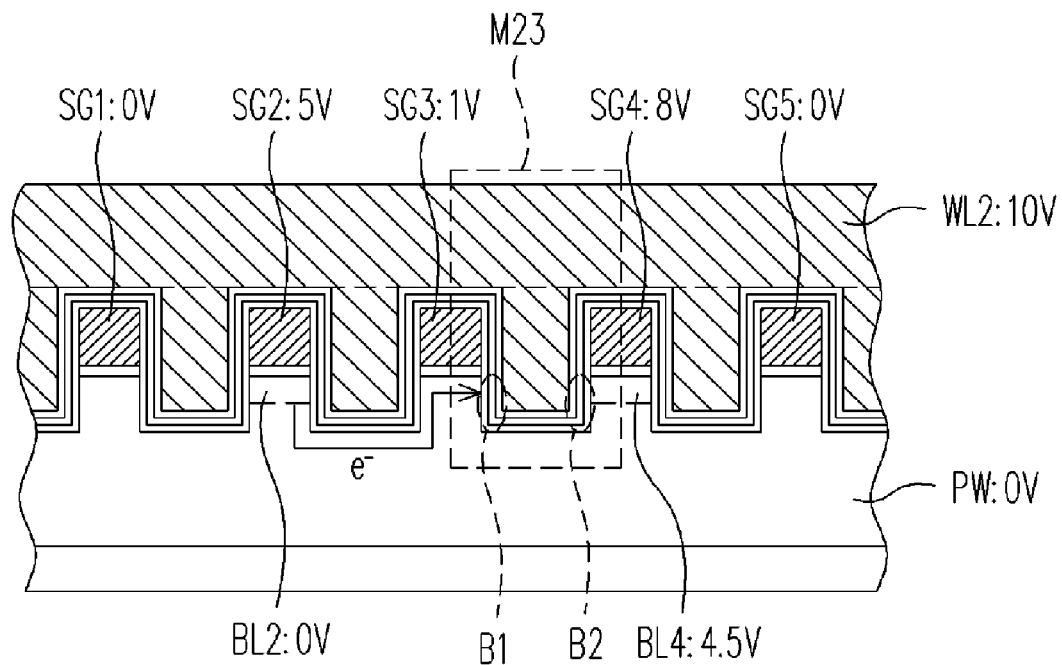
FIG. 4A is a cross-sectional view of a non-volatile memory showing a programming operation according to one embodiment of the present invention.
Figure 4B:
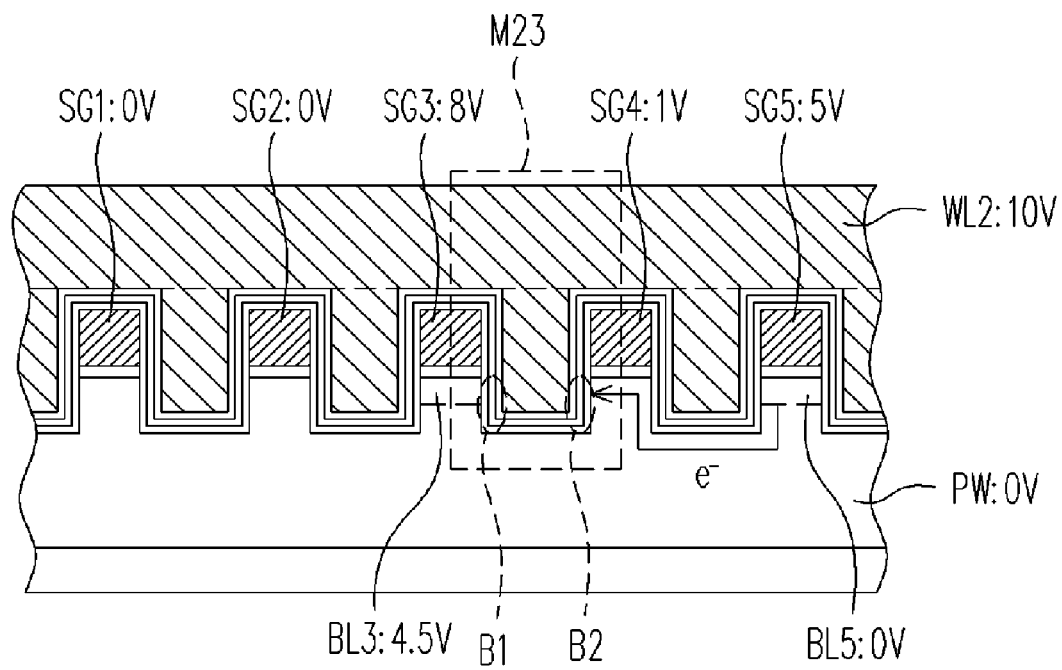
FIG. 4B is a cross-sectional view of a non-volatile memory showing a programming operation according to another embodiment of the present invention.
Figure 4C:
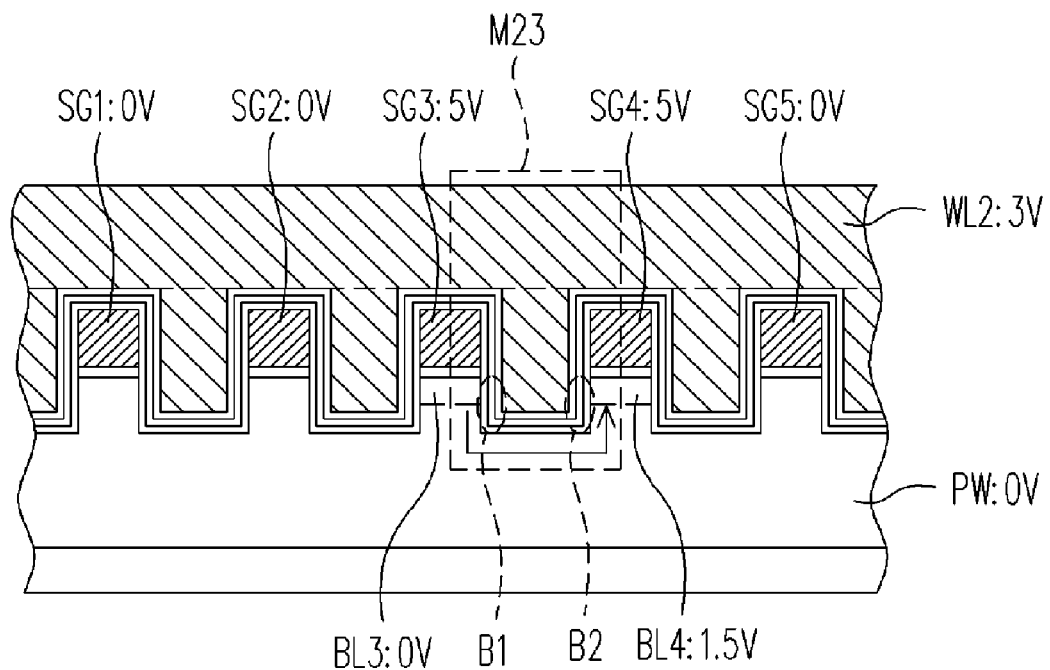
FIG. 4C is a cross-sectional view of a non-volatile memory showing a reading operation according to one embodiment of the present invention.
Figure 4D:
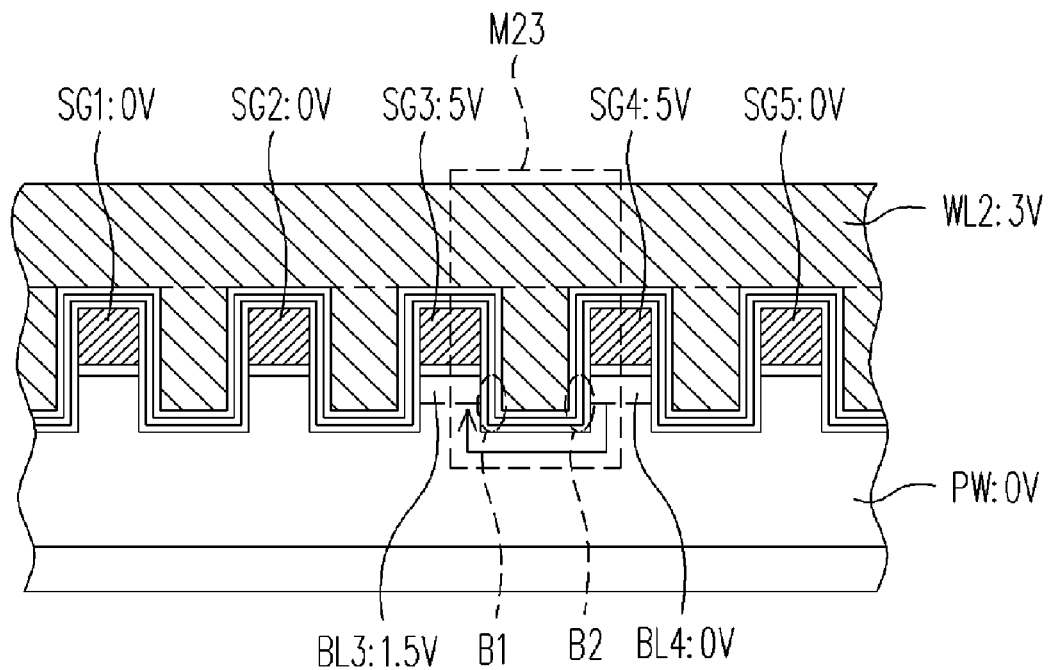
FIG. 4D is a cross-sectional view of a non-volatile memory showing a reading operation according to another embodiment of the present invention.
Figure 4E:
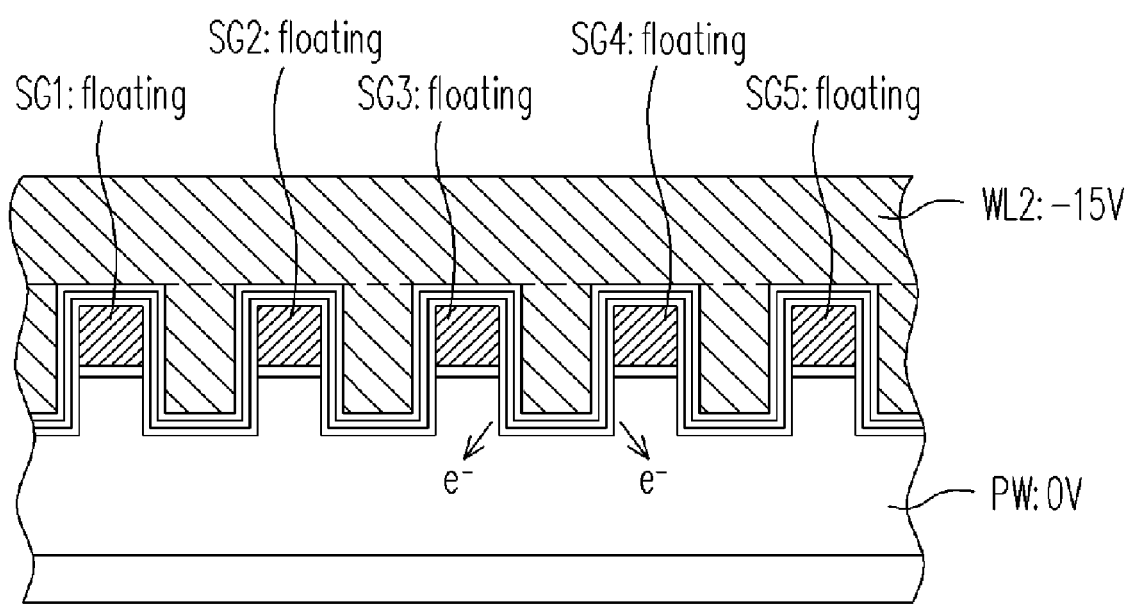
FIG. 4E is a cross-sectional view of a non-volatile memory showing an erasing operation according to one embodiment of the present invention.

FIG. 3 is a simplified circuit diagram of a memory array according to one embodiment of the present invention. Here, a memory array with 16 memory cells is used as an example to describe the operating modes of the memory array in the present invention. FIG. 4A is a cross-sectional view of a non-volatile memory showing a programming operation according to one embodiment of the present invention. FIG. 4B is a cross-sectional view of a non-volatile memory showing a programming operation according to another embodiment of the present invention. FIG. 4C is a cross-sectional view of a non-volatile memory showing a reading operation according to one embodiment of the present invention. FIG. 4D is a cross-sectional view of a non-volatile memory showing a reading operation according to another embodiment of the present invention. FIG. 4E is a cross-sectional view of a non-volatile memory showing an erasing operation according to one embodiment of the present invention.

As shown in FIG. 3, the memory cell array includes 16 memory cells M11~M44, a plurality of select gate lines SG1~SG5, a plurality of word lines WL1~WL4 and a plurality of bit lines BL1~BL5.

Each of the memory cells M11~M44 includes a select gate, a control gate and a charge-trapping layer. Furthermore, each pair of adjacent memory cell shares a single select gate.

Each memory cell array includes four serially connected memory cells. For example, the memory cells M11~M14 are serially connected together; the memory cells M21~M24 are serially connected together; the memory cells M31~M34 are serially connected together; and the memory cells M41~M44 are serially connected together.

The word lines WL1~WL4 respectively connect with all the control gates of memory cells on the same row. For example, the word line WL1 connects the control gate of the memory cells M11~M14 together; the word line WL2 connects the control gate of the memory cells M21~M24 together; the word line WL3 connects the control gate of the memory cells M31~M34 together; and, the word line WL4 connects the control gate of the memory cells M41~M44 together.

The select gate lines SG1~SG5 connect the select gate of the memory cells in the same column. When a voltage is applied to the select gate lines SG1~SG5, inversion layers are formed in the substrate underneath the select gate lines SG1~SG5. These inversion layers serve as the bit lines BL1~BL5.

In the following, the method of operating the non-volatile memory according to the present invention is described with an embodiment. However, the method of operating the non-volatile memory is not limited thereto. The method of operating the non-volatile memory in the present invention includes combining four memory cells together to form a working group. For example, to operate the memory cell M23, besides the word line WL2, the select gate line SG3, the select gate line SG4, the bit line BL3 and the bit line BL4 that are directly coupled to the memory cell M23, additional lines including the select gate line SG2, the select gate line SG5, the bit line BL2, the bit line BL5 adjacent to the select gate line SG2, and the select gate line SG4 are also required. In the following, the memory cell M23 is described for exemplary purpose.

As shown in FIGS. 3 and 4A, to send electric charges into the charge-trapping region B1 (the left bit) of the memory cell M23 in a programming operation, for example, a voltage Vp1 is applied to the word line WL2 coupled to the selected memory cell M23. The voltage Vp1 is about 10V, for example. Another voltage Vp2 is applied to the selected select gate line SG2 on the charge-trapping region B1 (the left bit) side and adjacent to the charge-trapping region B1 (the left bit). The voltage Vp2 is close to the threshold voltage of the select gate line SG3, for example, about 1V. A voltage Vp3 is applied to the selected select gate line SG2 on the charge-trapping region B1 (the left bit) side and adjacent to the selected select gate line SG3. The voltage Vp3 is, for example, about 5V so that a bit line BL2 is formed in the substrate underneath the selected select gate line SG2. A voltage Vp4 is applied to the selected bit line BL2. The voltage Vp4 is about 0V, for example. Another voltage Vp5 is applied to the selected select gate line SG4 on the charge-trapping region B2 (the right bit) side and adjacent to the charge-trapping region B2 (the right bit). The voltage Vp5 is, for example, about 8V so that a bit line BL4 is formed in the substrate underneath the selected select gate line SG4. A voltage Vp6 is applied to the selected bit line BL4. The voltage Vp6 is about 4.5V, for example. A voltage Vp7 is applied to the selected select gate line SG5 on the charge-trapping region B2 (the right bit) side and adjacent to the selected select gate line SG4. The voltage Vp7 is about 0V, for example. A voltage of about 0V is applied to other unselected select gate lines such as SG1 so that source side injection (SSI) is utilized to inject electrons into the charge-trapping region B1 (the left bit) and hence program the left bit of the memory cell M23. In the aforementioned operation, the voltages Vp5 and Vp3 should be higher than the voltage Vp2, the voltage Vp6 should be higher than the voltage Vp4, and the voltage Vp1 should be higher than the voltage Vp2 to facilitate source side injection (SSI). Since the control gate of the non-volatile memory is buried within the trench, the accelerated electrons can be directly injected into the charge-trapping region B1 (the left bit) on the sidewall of the trench when the electrons in the bit line BL2 move toward the bit line BL4. Hence, a higher operating efficiency is achieved. Furthermore, the charge-trapping region B1 (the left bit) and the charge-trapping region B2 (the right bit) are isolated from each other through the trench so that mutual interference is minimized.

As shown in FIGS. 3 and 4B, to send electric charges into the charge-trapping region B2 (the right bit) of the memory cell M23 in a programming operation, for example, a voltage Vp1 is applied to the word line WL2 coupled to the selected memory cell M23. The voltage Vp1 is about 10V, for example. Another voltage Vp2 is applied to the selected select gate line SG4 on the charge-trapping region B2 (the right bit) side and adjacent to the charge-trapping region B2 (the right bit). The voltage Vp2 is close to the threshold voltage of the select gate line SG4, for example, about 1V. A voltage Vp3 is applied to the selected select gate line SG4 on the charge-trapping region B2 (the right bit) side and adjacent to the selected select gate line SG4. The voltage Vp3 is, for example, about 5V so that a bit line BL5 is formed in the substrate underneath the selected select gate line SG5. A voltage Vp4 is applied to the selected bit line BL5. The voltage Vp4 is about 0V, for example. Another voltage Vp5 is applied to the selected select gate line SG3 on the charge-trapping region B1 (the left bit) side and adjacent to the charge-trapping region B1 (the left bit). The voltage Vp5 is, for example, about 8V so that a bit line BL3 is formed in the substrate underneath the selected select gate line SG3. A voltage Vp6 is applied to the selected bit line BL3. The voltage Vp6 is about 4.5V, for example. A voltage Vp7 is applied to the selected select gate line SG2 on the charge-trapping region B1 (the left bit) side and adjacent to the selected select gate line SG3. The voltage Vp7 is about 0V, for example. A voltage of about 0V is applied to other unselected select gate lines such as SG1 so that source side injection (SSI) is utilized to inject electrons into the charge-trapping region B2 (the right bit) and hence program the right bit of the memory cell M23. In the aforementioned operation, the voltages Vp5 and Vp3 should be higher than the voltage Vp2, the voltage Vp6 should be higher than the voltage Vp4, and the voltage Vp1 should be higher than the voltage Vp2 to facilitate source side injection (SSI). Similarly, since the control gate of the non-volatile memory is buried within the trench, the accelerated electrons can be directly injected into the charge-trapping region B2 (the right bit) on the sidewall of the trench when the electrons in the bit line BL5 move toward the bit line BL3. Hence, a higher operating efficiency is attained. Furthermore, the charge-trapping region B1 (the left bit) and the charge-trapping region B2 (the right bit) are isolated from each other through the trench so that interference from each other is minimized.

As shown in FIGS. 3 and 4C, to read data from the charge-trapping region B1 (the left bit) of the memory cell M23 in a reading operation, for example, a voltage Vr1 is applied to the selected word line coupled to the selected memory cell M23. The voltage Vr1 is about 3V, for example. A voltage Vr2 is applied to the selected select gate line SG3 on the charge-trapping region B1 (the left bit) side and adjacent to the charge-trapping region B1 (the left bit). The voltage Vr2 is, for example, 5V so that a bit line BL3 is formed in the substrate underneath the selected select gate line SG3. A voltage Vr3 is applied to the selected bit line BL3. The voltage Vr3 is about 0V, for example. A voltage Vr4 is applied to the selected select gate lines SG4 on the charge-trapping region B2 (the right bit) side and adjacent to the charge-trapping region B2 (the right bit). The voltage Vr4 is, for example, about 5V so that the bit line BL4 is formed in the substrate underneath the selected select gate line SG4. A voltage Vr5 is applied to the selected bit line BL4. The voltage Vr5 is about 1.5V so that the left bit can be read from the memory cell M23. In this operation, the voltages Vr2 and Vr4 should be higher than the voltage Vr5 and the voltage Vr5 should be higher than the voltage Vr3. The voltage Vr1 should be higher than the threshold voltage of the memory cells without any trapped charges but smaller than the threshold voltage of the memory cells with electric charges.

As shown in FIGS. 3 and 4D, to read data from the charge-trapping region B2 (the right bit) of the memory cell M23 in a reading operation, for example, a voltage Vr1 is applied to the selected word line coupled to the selected memory cell M23. The voltage Vr1 is about 3V, for example. A voltage Vr2 is applied to the selected select gate line SG4 on the charge-trapping region B2 (the right bit) side and adjacent to the charge-trapping region B2 (the right bit). The voltage Vr2 is, for example, 5V so that a bit line BL4 is formed in the substrate underneath the selected select gate line SG4. A voltage Vr3 is applied to the selected bit line BL4. The voltage Vr3 is about 0V, for example. A voltage Vr4 is applied to the selected select gate lines SG3 on the charge-trapping region B1 (the left bit) side and adjacent to the charge-trapping region B1 (the left bit). The voltage Vr4 is, for example, about 5V so that the bit line BL3 is formed in the substrate underneath the selected select gate line SG3. A voltage Vr5 is applied to the selected bit line BL3. The voltage Vr5 is about 1.5V so that the right bit can be read from the memory cell M23. In this operation, the voltages Vr2 and Vr4 should be higher than the voltage Vr5, and the voltage Vr5 should be higher than the voltage Vr3. The voltage Vr1 should be higher than the threshold voltage of the memory cells without any trapped charges but smaller than the threshold voltage of the memory cells with electric charges. Because the channel is closed with a small current when the total charge inside the charge-trapping layer is negative and because the channel is opened with a large current when the total charge inside the charge-trapping layer is positive, the open-close/current size in the channel can be used to determine whether a '1' or '0' bit data is stored inside the memory cell.

As shown in FIGS. 3 and 4E, in an erasing operation, a voltage Ve1 is applied to the selected word line and a voltage Ve2 is applied to the substrate so that the select gate lines SG1~SG5 are in a floating state and the electrons trapped inside the composite layer are tunnelled into the substrate. Hence, the data inside the memory cell is erased. The voltage differential between the voltage Ve1 and the voltage Ve2 triggers the FN tunneling effect. The voltage differential between the voltage Ve1 and the voltage Ve2 is between −12V to −20V, for example. For example, the voltage Ve1 is about −15V and the voltage Ve2 is about 0V.

The aforementioned method of operating the non-volatile memory of the present invention utilizes source side injection (SSI) to program a single bit in a unit memory cell and utilizes FN tunneling to erase the data within the memory cells so that the electron injection efficiency is high. Therefore, memory cell current can be reduced and operating speed can be increased. Moreover, with a small current loss, the power loss from the chip is effectively reduced.

Because the control gates are buried inside the trenches of the substrate in the non-volatile memory, the accelerated electrons are directly injected into the charge-trapping regions on the sidewalls of the trenches. Therefore, the operating efficiency is high. Furthermore, the two charge-trapping regions (the left bit and the right bit) inside a single memory cell are effectively isolated from each other through the trench. Hence, interference between the two areas is significantly minimized.

Figure 5A:
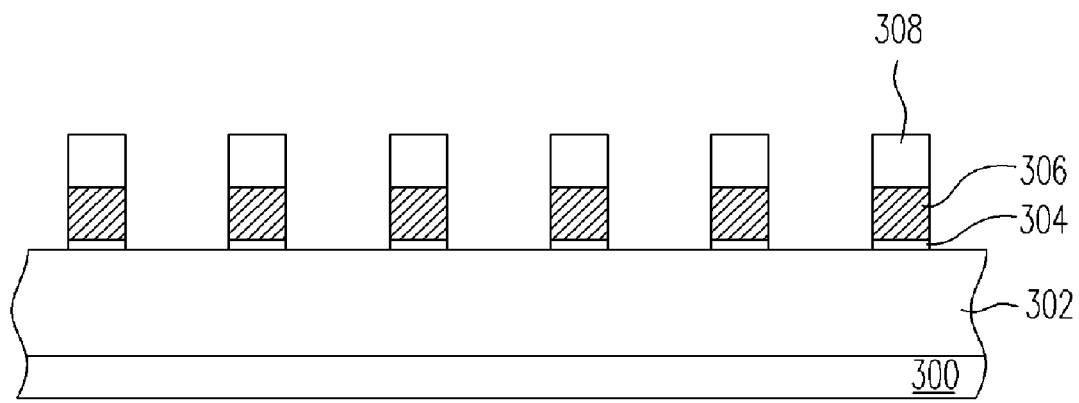
FIGS. 5A through 5C are schematic cross-sectional views showing the steps for fabricating a non-volatile memory according to one embodiment of the present invention.
Figure 5B:
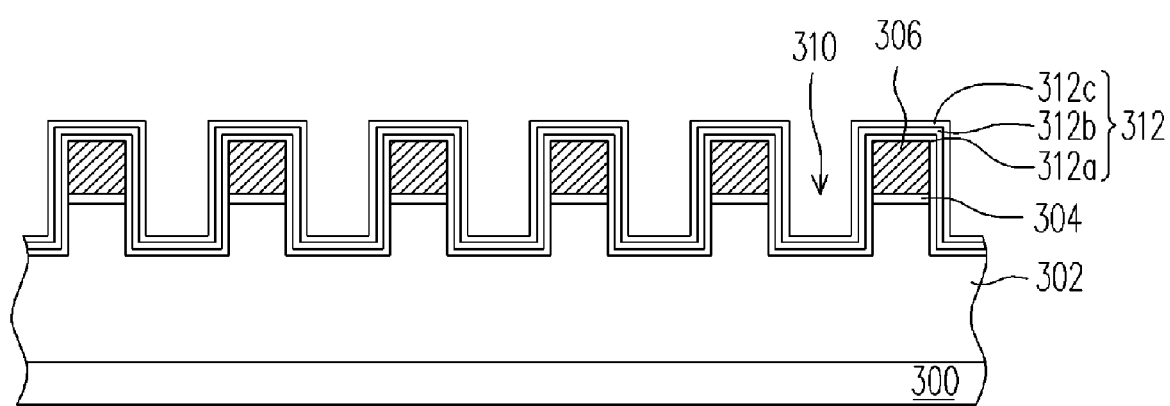
Figure 5C:
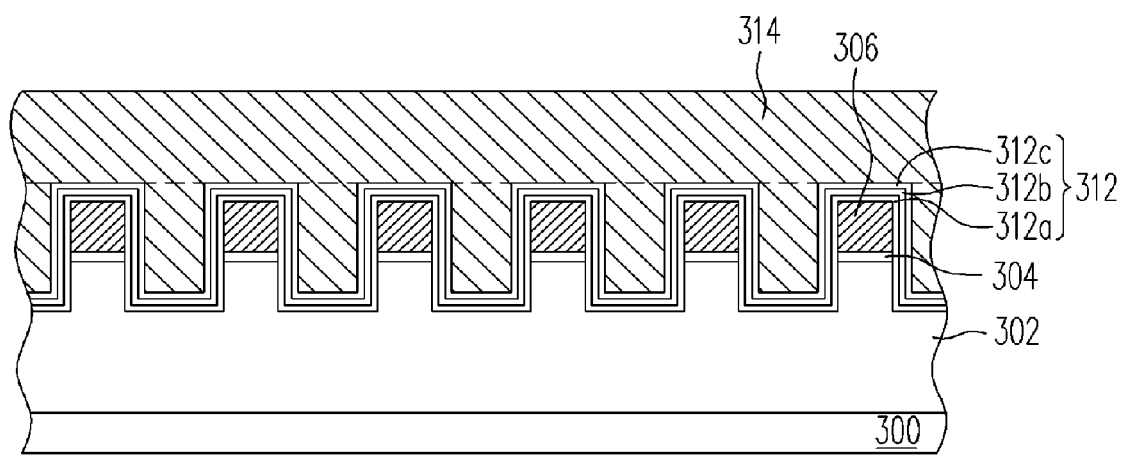

FIGS. 5A through 5C are schematic cross-sectional views showing the steps for fabricating a non-volatile memory according to one embodiment of the present invention. In fact, FIGS. 5A through 5C are a series of cross-sectional views at different processing stages along line A-A' of FIG. 2A. First, as shown in FIG. 5A, a substrate 300 such as a silicon substrate is provided. Then, a well 302 is formed in the substrate 300. The well 302 is a p-type well, for example. Thereafter, a plurality of stacked gate structure including a dielectric layer 304, a conductive layer 306, and a mask layer 308 sequentially stacked on the substrate 300 are formed. To form the stacked gate structures, a layer of dielectric material, conductive material, and insulating material are sequentially deposited over the substrate, and then a photolithographic and etching process is applied to pattern the layers. The dielectric layer is a silicon oxide layer formed, for example, by performing a thermal oxidation process. The conductive layer is a doped polysilicon layer, for example. The method of forming the conductive layer includes depositing a layer of undoped polysilicon material in a chemical vapor deposition process and then performing an ion implantation process thereafter or performing an in-situ doping in a chemical vapor deposition process, for example. The insulating layer is a silicon nitride layer formed, for example, by performing a chemical vapor deposition process. The conductive layer 306 serves as the select gate and the dielectric layer 304 serves as a select gate dielectric layer.

As shown in FIG. 5B, a portion of the substrate 300 is removed using the mask layer 308 as a mask to form a plurality of trenches 310 in the substrate 300. The method of removing a portion of the substrate 300 includes performing a dry etching operation such as a reactive ion etching operation. After removing the mask layer 308, a composite layer 312 is formed on the substrate 300. The mask layer 308 is removed by performing a wet etching operation, for example. The composite layer 312 includes a bottom dielectric layer 312a, a charge-trapping layer 312b, and a top dielectric layer 312c. The bottom dielectric layer 321a is fabricated using silicon oxide, the charge-trapping layer 312b is fabricated using silicon nitride, and the top dielectric layer 321c is fabricated using silicon oxide, for example. The method of forming the composite layer 312 includes forming a dielectric layer 312a, a charge-trapping layer 312b, and a top dielectric layer 312c, sequentially over the substrate 300 in a chemical vapor deposition process. Obviously, the composite layer 312 can be formed by performing a thermal oxidation process to form the bottom dielectric layer 312a and then performing a chemical vapor deposition process to form the charge-trapping layer 312b and the top dielectric layer 321c.

As shown in FIG. 5C, a plurality of conductive layers 314 are formed over the substrate 300. The conductive layers 314 fill up the gaps between the conductive layers 306 and the trenches 310 within the substrate 300. Furthermore, the conductive layers 314 are arranged in parallel to each other and extend in a direction that crosses over the extension direction of the conductive layers 306 (the select gates). The conductive layers 314 serve as word lines. The conductive layers 314 (the word lines) are formed using the following steps. First, a conductive material layer is formed over the substrate 300. Thereafter, a chemical-mechanical polishing operation or a back etching operation is performed to planarize the conductive material layer. Finally, the conductive material layer is patterned to form a plurality of linear conductive layers 314 (word lines). The conductive layers 314 are doped polysilicon layers formed, for example, by depositing undoped polysilicon in a chemical vapor deposition process and then performing an ion implantation on the undoped polysilicon layer thereafter. Alternatively, the conductive layers 314 are formed by performing an in-situ doping process in a chemical vapor deposition process. After that, other steps necessary for fabricating a complete memory array are performed. Since these steps should be familiar to people skilled in the art of semiconductor manufacturing, a detailed description is omitted.

In the aforementioned embodiment, there is no device isolation structure between various memory cell arrays, and there is no contact and doped polysilicon between various memory cells. Hence, the process of fabricating the memory cell array is simple and the overall level of integration of the memory array is increased.

Although the example in the aforementioned embodiment uses five memory cell structures altogether, there is no particular restriction on the number of memory cell structures that can be used. Obviously, the number of memory cells chained together may depend on the actual requirement. For example, a total of 32 to 64 memory cell structures can be serially connected through a word line. Furthermore, the method for fabricating the memory cell array in the present invention is actually applied to form an integrative memory array.

It is apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory, comprising:
   a substrate having a plurality of trenches therein, wherein the trenches are arranged in parallel and extend in a first direction;
   a plurality of select gates, each disposed on the substrate between two adjacent trenches respectively;
   a plurality of select gate dielectric layers disposed between the select gates and the substrate;
   a plurality of composite layers disposed over the surface of the trenches, each composite layer including a charge trapping layer; and
   a plurality of word lines arranged in parallel in a second direction, wherein each of the word lines fills the trenches between adjacent select gates and is disposed over the composite layers.

2. The non-volatile memory of claim 1, wherein each composite layer further comprises a bottom dielectric layer and a top dielectric layer.

3. The non-volatile memory of claim 1, wherein the material constituting the charge-trapping layer comprises silicon nitride or doped polysilicon.

4. The non-volatile memory of claim 2, wherein the material constituting the bottom dielectric layer and the top dielectric layer comprises silicon oxide.

5. The non-volatile memory of claim 1, wherein the composite layers and the word lines disposed thereon constitute a plurality of two-bits memory cells respectively.

6. The non-volatile memory of claim 1, wherein the material constituting the select gates and the word lines comprises doped polysilicon.

7. The non-volatile memory of claim 1, wherein the memory further comprises a plurality of bit lines formed in the substrate underneath the select gates when a voltage is applied to the select gates.

8. The non-volatile memory of claim 1, wherein the composite layers cover the surface of the trenches and the surface of the select gates.

* * * * *